(12) United States Patent
Natsui et al.

(10) Patent No.: US 11,790,966 B2
(45) Date of Patent: Oct. 17, 2023

(54) NONVOLATILE LOGIC CIRCUIT

(71) Applicant: TOHOKU UNIVERSITY, Miyagi (JP)

(72) Inventors: Masanori Natsui, Miyagi (JP); Takahiro Hanyu, Miyagi (JP); Tetsuo Endoh, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 341 days.

(21) Appl. No.: 17/417,917

(22) PCT Filed: Nov. 28, 2019

(86) PCT No.: PCT/JP2019/046590
§ 371 (c)(1),
(2) Date: Aug. 25, 2021

(87) PCT Pub. No.: WO2020/137341
PCT Pub. Date: Jul. 2, 2020

(65) Prior Publication Data
US 2022/0076722 A1 Mar. 10, 2022

(30) Foreign Application Priority Data
Dec. 25, 2018 (JP) ................. 2018-241191

(51) Int. Cl.
*G11C 11/16* (2006.01)
*H03K 19/18* (2006.01)
(Continued)

(52) U.S. Cl.
CPC ............ *G11C 11/161* (2013.01); *H03K 19/18* (2013.01); *H10B 61/00* (2023.02); *H10N 50/80* (2023.02); *H03K 19/20* (2013.01)

(58) Field of Classification Search
CPC ................... G11C 8/08; G11C 11/161
See application file for complete search history.

(56) References Cited

U.S. PATENT DOCUMENTS

2014/0362637 A1* 12/2014 Jeong ............... G11C 8/08
365/149
2016/0259676 A1  9/2016 Tomishima

FOREIGN PATENT DOCUMENTS

JP  2003217277 A  7/2003
JP  2005235307 A  9/2005
(Continued)

OTHER PUBLICATIONS

W. Zhao, C. Chappert, V. Javerliac and J. Noziere, "High Speed, High Stability and Low Power Sensing Amplifier for MTJ/CMOS Hybrid Logic Circuits," in IEEE Transactions on Magnetics, vol. 45, No. 10, pp. 3784-3787, Oct. 2009, doi: 10.1109/TMAG.2009.2024325.

(Continued)

*Primary Examiner* — Jason Lappas
(74) *Attorney, Agent, or Firm* — Fox Rothschild LLP; Carol Thorstad-Forsyth

(57) ABSTRACT

A nonvolatile logic circuit includes: a memory unit having a pair of resistive memory elements; a computation unit connected to the memory unit and configured to perform an operation based on an input signal and a logic value corresponding to a resistance state of the pair of resistive memory elements; a determination circuit configured to determine whether the resistance state of the pair of resistive memory elements is a complementary state or a non-complementary state; and an output circuit connected to the computation unit and the determination circuit, and configured to output a signal corresponding to an operation result by the computation unit or a signal corresponding to a determination result by the determination circuit.

7 Claims, 16 Drawing Sheets

(51) Int. Cl.
*H10B 61/00* (2023.01)
*H10N 50/80* (2023.01)
*H03K 19/20* (2006.01)

(56) References Cited

FOREIGN PATENT DOCUMENTS

| JP | 2015170378 A | 9/2015 |
|----|--------------|--------|
| WO | 2013047213 A1 | 4/2013 |
| WO | 2013187193 A1 | 12/2013 |

OTHER PUBLICATIONS

R. Bishnoi, M. Ebrahimi, F. Oboril and M. B. Tahoori, "Read disturb fault detection in STT-MRAM," 2014 International Test Conference, 2014, pp. 1-7, doi: 10.1109/TEST.2014.7035342.

* cited by examiner

FIG. 12

| IN<br>M<br>OUT | (in1, in2)<br>(m1, m2)<br>(out1, out2) |
|---|---|
| +1 | (0, 1) |
| 0 | (0, 0) |
| −1 | (1, 0) |

FIG. 13

| IN × M = OUT | in1 | in2 | m1 | m2 | out1 | out2 |
|---|---|---|---|---|---|---|
| 0 × 0 = 0 | 0 | 0 | 0 | 0 | 0 | 0 |
| 0 × (+1) = 0 | 0 | 0 | 0 | 1 | 0 | 0 |
| 0 × (−1) = 0 | 0 | 0 | 1 | 0 | 0 | 0 |
| (+1) × 0 = 0 | 0 | 1 | 0 | 0 | 0 | 0 |
| (+1) × (+1) = (+1) | 0 | 1 | 0 | 1 | 0 | 1 |
| (+1) × (−1) = (−1) | 0 | 1 | 1 | 0 | 1 | 0 |
| (−1) × 0 = 0 | 1 | 0 | 0 | 0 | 0 | 0 |
| (−1) × (+1) = (−1) | 1 | 0 | 0 | 1 | 1 | 0 |
| (−1) × (−1) = (+1) | 1 | 0 | 1 | 0 | 0 | 1 |
| * | otherwise | | | | * | * |

NONVOLATILE LOGIC CIRCUIT

CROSS-REFERENCE TO RELATED APPLICATIONS

The present application is a U.S. National Phase of International Patent Application No. PCT/JP2019/046590, filed on Nov. 28, 2019, which claims the benefit and priority of Japanese Patent Application No. 2018-241191 filed on Dec. 25, 2018. The contents of the above applications are incorporated herein by reference in their entirety.

TECHNICAL FIELD

The present invention relates to a nonvolatile logic circuit.

BACKGROUND ART

Artificial intelligence (AI) technology or deep learning technology has been developed rapidly with growing use of big data and has been applied in various fields such as image recognition, voice recognition, text generation, and games. However, in order to extend its application range, there is a need to solve issues of huge computational cost and hardware cost. Recently, quantization has attracted attention as a technique for reducing these costs. This technique enables the reduction in computational cost by replacing main operations in deep neural networks (DNNs), such as multiplication and addition conventionally performed using floating-point or fixed-point representation, with cost-efficient operations performed using quantized representation. In particular, ternary neural networks (TNNs), which use ternary representation, replace product-sum operations in neural networks with logical operations, and exhibit sufficient recognition performance, thereby drawing significant attention as effective techniques in hardware implementation.

Meanwhile, nonvolatile logic circuits utilizing magnetic tunnel junction devices (MTJ devices) as resistive memory elements have recently been proposed. The conventional nonvolatile logic circuits represent 1-bit information by assigning logic values ("0" and "1") to complementary states ((low resistance, high resistance) and (high resistance, low resistance)) of a pair of MTJ devices (see Non-Patent Literature 1, for example).

CITATION LIST

Non-Patent Literatures

Non-Patent Literature 1: W. Zhao, et al., "High speed, high stability and low power sensing amplifier for MTJ/CMOS hybrid logic circuits," IEEE Transactions on Magnetics, Vol. 45, No. 10, pp. 3784-3787, 2009.

Non-Patent Literature 2: Rajendra Bishnoi et al., "Read disturb fault detection in STT-MRAM," in Proceedings of International Test Conference (ITC), IEEE, pp. 1-7, 2014.

SUMMARY OF INVENTION

Technical Problem

In the conventional nonvolatile logic circuit, only a complementary state of the pair of MTJ devices is used, whereas a non-complementary state ((low resistance, low resistance) or (high resistance, high resistance)) is not utilized due to an unstable circuit behavior and other factors. For this reason, in order to construct TNN with ternary representation (such as −1, 0, +1) by the conventional nonvolatile logic circuit, four MTJ devices are needed to represent ternary information (2 bits), which results in larger circuit area and longer delay.

Regarding the nonvolatile logic circuits having MTJ devices, error detection mechanisms have recently been proposed. For example, Non-Patent Literature 2 discloses a read-disturb-detection circuit (FIG. 5) in a spin-transfer-torque magnetic random-access memory (STT-MRAM). The circuit of Non-Patent Literature 2 at least needs to include, for a single MTJ device, a reference resistor whose resistance value is the middle of the two resistance states that the single MTJ device can take, a control circuit, and a comparison circuit configured to compare the resistance of the MTJ device with that of the reference resistor. Therefore, this circuit configuration leads to large overhead. Employing two circuits in combination, each of which is the read-disturb-detection circuit disclosed in Non-Patent Literature 2, may make it possible to determine whether a pair of MTJ devices is in a complementary state or a non-complementary state. However, such a circuit configuration requires an even larger circuit area.

The present invention has been made in view of the foregoing, and an object of the invention is to provide a nonvolatile logic circuit which utilizes a non-complementary state of a pair of resistive memory elements to achieve a sophisticated function without an increase in circuit area.

Solution to Problem

A nonvolatile logic circuit according to some embodiments of the invention includes: a memory unit having a pair of resistive memory elements; a computation unit connected to the memory unit and configured to perform an operation based on an input signal and a logic value corresponding to a resistance state of the pair of resistive memory elements; a determination circuit configured to determine whether the resistance state of the pair of resistive memory elements is a complementary state or a non-complementary state; and an output circuit connected to the computation unit and the determination circuit, and configured to output a signal corresponding to an operation result by the computation unit or a signal corresponding to a determination result by the determination circuit.

Advantageous Effects of Invention

According to the present invention, a determination is made as to whether the resistance state of the pair of resistive memory elements is a complementary state or a non-complementary state, and a signal corresponding to the determination result is output. This makes it possible to achieve a sophisticated function without an increase in circuit area.

BRIEF DESCRIPTION OF DRAWINGS

FIG. 12 is a table illustrating an assignment of information to the signals shown in FIG. 11.

FIG. 13 is a truth table illustrating a calculation function of each nonvolatile logic circuit constituting the computation apparatus of Example 1.

DESCRIPTION OF EMBODIMENTS

Exemplary embodiments of the present invention will be described below with reference to the drawings. The same reference signs are used to designate the same or similar components throughout the drawings.

First, reference will be made to a configuration of a nonvolatile logic circuit 10 according to the embodiments of the present invention.

Figure 1:
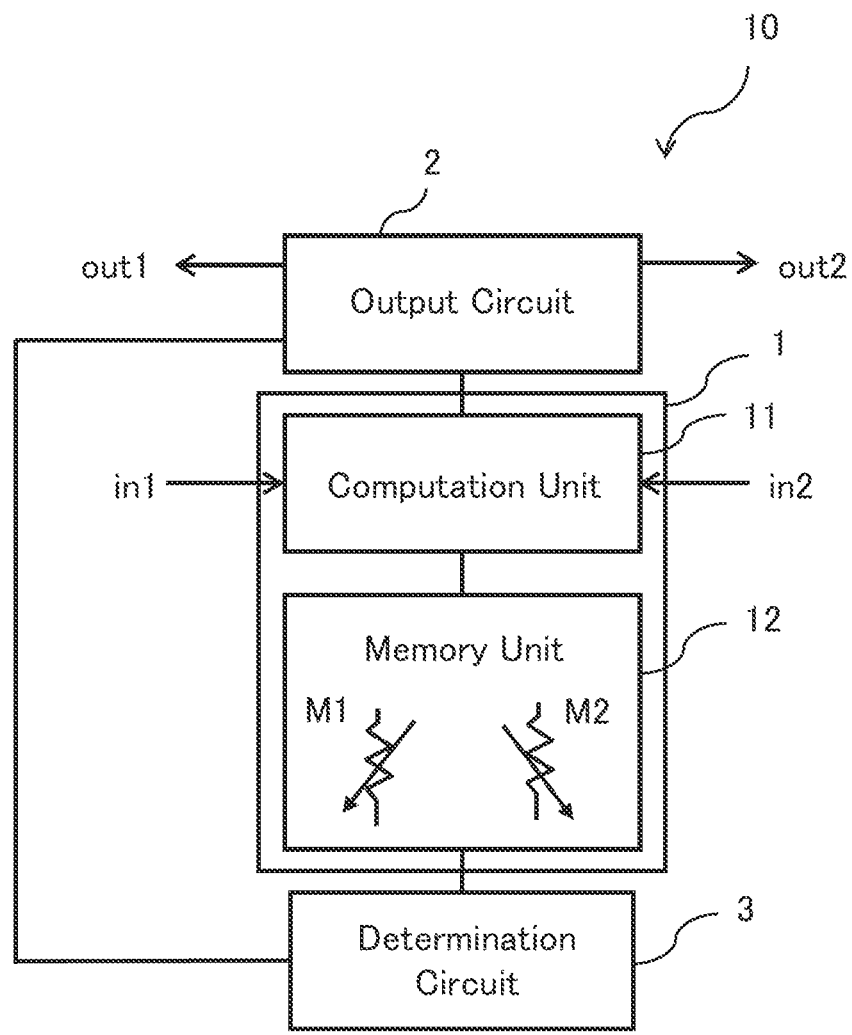
FIG. 1 is a functional block diagram of a nonvolatile logic circuit according to embodiments of the present invention.

FIG. 1 shows a functional block diagram of the nonvolatile logic circuit 10. The nonvolatile logic circuit 10 is a nonvolatile logic-in-memory circuit, and includes a computation circuit 1, an output circuit 2, and a determination circuit 3 as shown in FIG. 1.

The computation circuit 1 includes a computation unit 11 as a logic unit, and a memory unit 12 as a memory having a pair of resistive memory elements. The memory unit 12 has a pair of magnetic tunnel junction devices (MTJ devices) M1 and M2 as the pair of resistive memory elements.

The computation unit 11 is connected to the memory unit 12 and configured to perform an operation based on input signals (in1 and in2) and a logic value corresponding to a resistance state (a complementary state, a non-complementary state) of the MTJ devices M1 and M2. Here, a complementary state indicates that the resistance state of the pair of MTJ devices M1 and M2 is (low resistance, high resistance) or (high resistance, low resistance), and a non-complementary state indicates that the resistance state of the pair of MTJ devices M1 and M2 is (low resistance, low resistance) or (high resistance, high resistance).

The determination circuit 3 is connected to the memory unit 12 and the output circuit 2 and configured to determine whether the pair of MTJ devices M1 and M2 is in a complementary state or a non-complementary state.

The output circuit 2 is connected to the computation unit 11 and the determination circuit 3, and configured to output, as output signals (out1 and out2), either signals corresponding to the operation result by the computation unit 11 or signals corresponding to the determination result by the determination circuit 3.

A detailed explanation of the configuration of the nonvolatile logic circuit 10 will be provided later (see FIGS. 4 and 5).

Figure 2A:
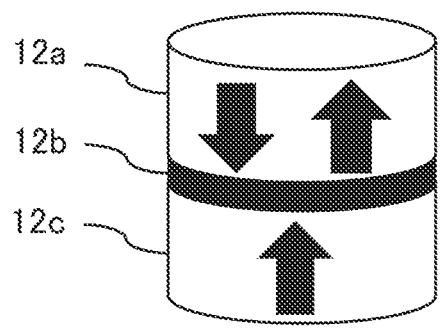
FIG. 2A is a schematic diagram illustrating a structure of each MTJ device constituting a memory unit of the nonvolatile logic circuit.

As shown in FIG. 2A, each of the MTJ devices M1 and M2 constituting the memory unit 12 has a stacking structure including a free layer 12a, a barrier layer 12b, and a fixed layer 12c. The free layer 12a and the fixed layer 12c are made of a ferromagnetic material such as CoFeB, and the barrier layer 12b is a thin film made of an insulating material such as MgO.

Figure 2B:
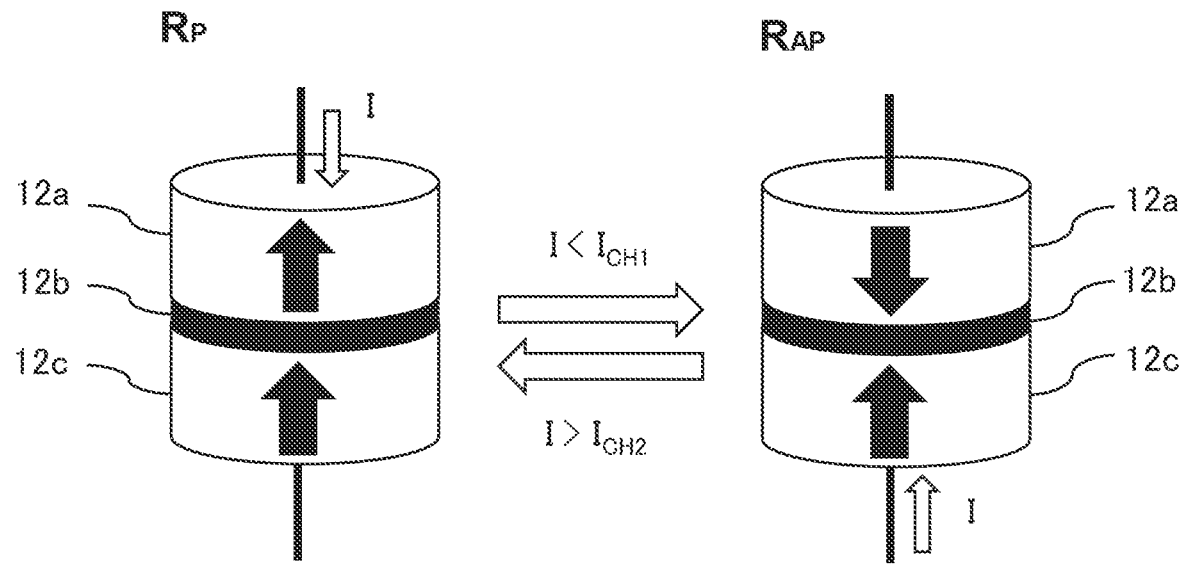
FIG. 2B is a schematic diagram illustrating switching of a MTJ device.

As shown in FIG. 2B, the MTJ device is in a low-resistance state $R_P$ when the magnetization direction of the fixed layer 12c and the magnetization direction of the free layer 12a are the same (parallel state), and the MTJ device is in a high-resistance state $R_{AP}$ when the magnetization direction of the fixed layer 12c and the magnetization direction of the free layer 12a are opposite to each other (anti-parallel state).

Figure 2C:
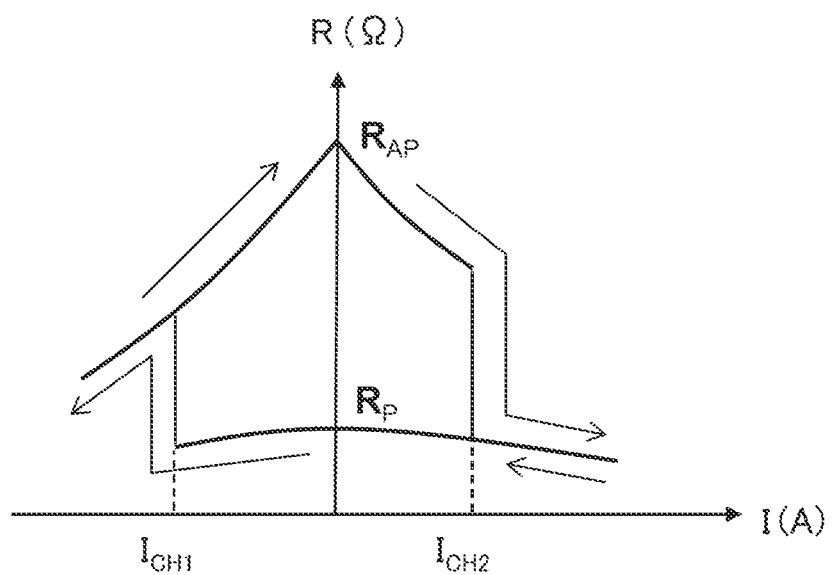
FIG. 2C is a graph illustrating resistance versus current characteristics of a MTJ device.

As shown in FIGS. 2B and 2C, if an electric current I flows through a path from the fixed layer 12c toward the free layer 12a when the MTJ device is in a high-resistance state $R_{AP}$ (anti-parallel state), the resistance of the MTJ device gradually decreases with an increase of the electric current I while keeping the high-resistance state $R_{AP}$. When the electric current I exceeds a threshold $I_{CH2}$ ($I > I_{CH2}$), the magnetization of the free layer 12a is reversed, thus the MTJ device transitions to a low-resistance state $R_P$ (parallel state). If the electric current I decreases in the low-resistance state $R_P$, the MTJ device is kept in the low-resistance state $R_P$, and then when the electric current I changes its direction and increases so that the absolute value of the electric current I exceeds the absolute value of a threshold $I_{CH1}$ ($|I| > |I_{CH1}|$ or $I < I_{CH1}$), the magnetization of the free layer 12a is reversed, thus the MTJ device transitions to a high-resistance state $R_{AP}$ (anti-parallel state).

For example, logic values "0" and "1" are assigned respectively to complementary states ($R_P$, $R_{AP}$) and ($R_{AP}$, $R_P$) of the pair of MTJ devices M1 and M2 to represent 1-bit information. If non-complementary states (such as ($R_P$, $R_P$)) are also utilized as a means for representing information, it is possible to represent 2-bit information (see FIGS. 10 to 13).

Figure 3:
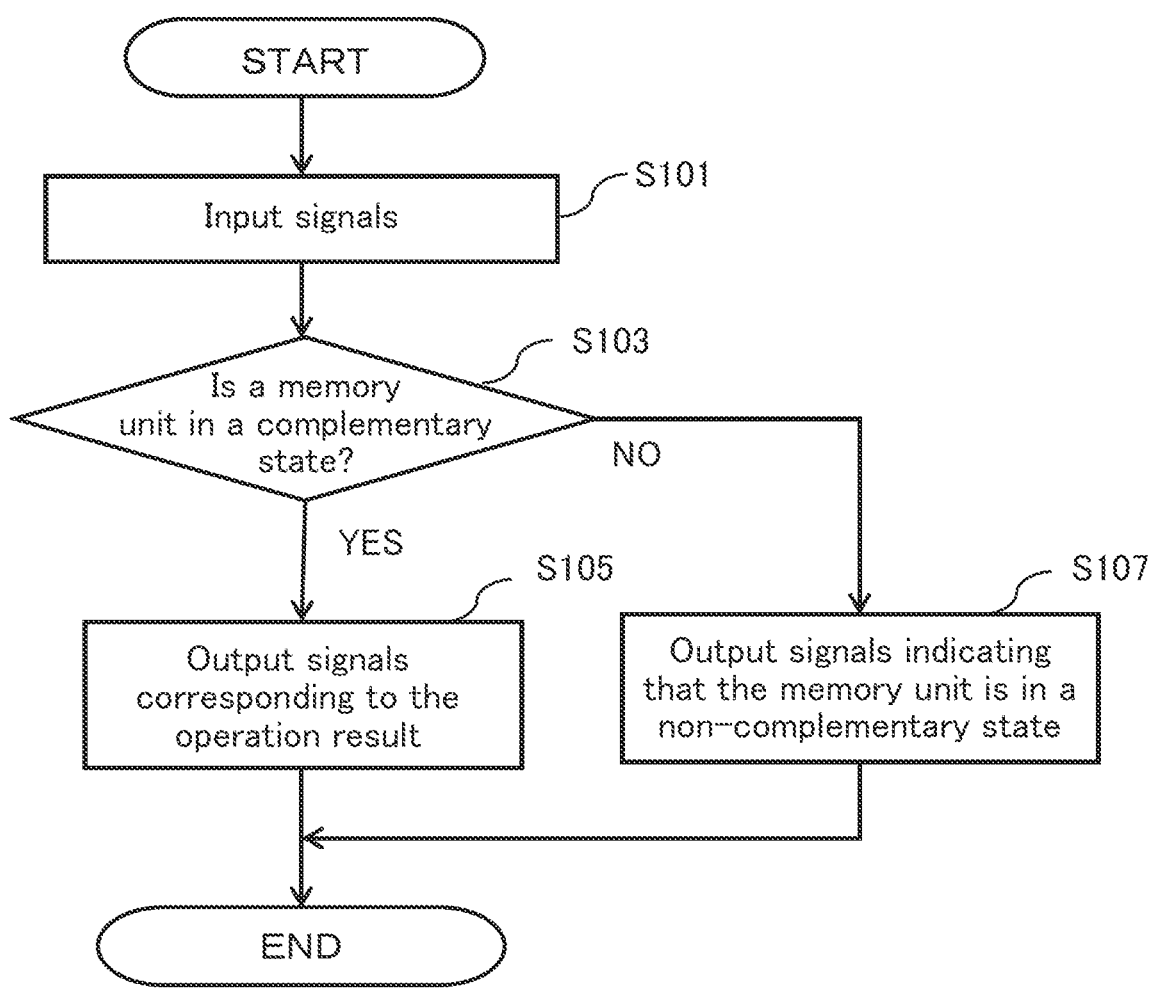
FIG. 3 is a flowchart illustrating a process performed by the nonvolatile logic circuit of the embodiments.

Next, a process flow performed by the nonvolatile logic circuit 10 will be described with reference to a flowchart in FIG. 3.

When the computation unit 11 receives input signals in1 and in2 (Step S101), the determination circuit 3 detects voltage of a pair of nodes (nodes A and B to be described later) of the output circuit 2, the voltage being configured to vary depending on the resistance state of the pair of MTJ devices M1 and M2 of the memory unit 12, and determines whether the pair of MTJ devices M1 and M2 is in a complementary state or a non-complementary state (Step S103).

If the pair of MTJ devices M1 and M2 is in a complementary state (Step S103: YES), the computation unit 11 performs the operation using the input signals in1 and in2 and the logic value corresponding to the complementary state, and the output circuit 2 outputs signals out1 and out2 corresponding to the operation result by the computation unit 11 (Step S105).

If the pair of MTJ devices M1 and M2 is in a non-complementary state (Step S103: NO), the output circuit 2 outputs signals out1 and out2 indicating that the pair of MTJ devices M1 and M2 is in a non-complementary state (Step S107).

If the computation unit 11 has a circuit that is designed to perform an operation using the non-complementary state of the pair of MTJ devices M1 and M2 (e.g., a circuit shown in FIG. 5 to be described later), the computation unit 11 performs, in Step S107, the operation using the input signals in1 and in2 and the logic value corresponding to the non-complementary state, and the output circuit 2 outputs signals out1 and out2 corresponding to the operation result by the computation unit 11.

Next, the configuration of the nonvolatile logic circuit 10 is described in detail. FIG. 4 shows the configuration of the nonvolatile logic circuit 10.

The output circuit 2 is a pre-charge sense amplifier (PCSA) (see Non-Patent Literature 1) and includes complementary metal-oxide semiconductor (CMOS) inverters 23, 24, 25, and 26, and P-channel MOS (PMOS) transistors 21 and 22. An input terminal of the CMOS inverter 23 is connected to an output terminal of the CMOS inverter 24, and an input terminal of the CMOS inverter 24 is connected to an output terminal of the CMOS inverter 23. The output terminal of the CMOS inverter 23 is connected to an input terminal of the CMOS inverter 25 and a drain of the PMOS transistor 21, and the output terminal of the CMOS inverter 24 is connected to an input terminal of the CMOS inverter 26 and a drain of the PMOS transistor 22. Sources of the PMOS transistors 21 and 22 are connected to a power supply VDD, and a clock clk is input into each of gates of the PMOS transistors 21 and 22.

Hereinafter, a connection point among the drain of the PMOS transistor 21, the output terminal of the CMOS inverter 23, and the input terminal of the CMOS inverter 25 is referred to as "node A", and a connection point among the drain of the PMOS transistor 22, the output terminal of the CMOS inverter 24, and the input terminal of the CMOS inverter 26 is referred to as "node B".

The determination circuit 3 includes N-channel MOS (NMOS) transistors 13, 31, and 32, a PMOS transistor 33a, an NMOS transistor 33b, a PMOS transistor 34a, an NMOS transistor 34b, an inverter 35, an inverter 36, a PMOS transistor 37, and a PMOS transistor 38.

A source of the PMOS transistor 33a is connected to the power supply VDD, and the clock clk is input into a gate thereof. A drain of the PMOS transistor 33a is connected to a drain of the NMOS transistor 33b. A source of the NMOS transistor 33b is grounded, and a gate thereof is connected to an output terminal of the inverter 35. An input terminal of the inverter 35 is connected to the node B. Hereinafter, a connection point between the PMOS transistor 33a and the NMOS transistor 33b is referred to as "node C".

A source of the PMOS transistor 34a is connected to the power supply VDD, and the clock clk is input into a gate thereof. A drain of the PMOS transistor 34a is connected to a drain of the NMOS transistor 34b. A source of the NMOS transistor 34b is grounded, and a gate thereof is connected to an output terminal of the inverter 36. An input terminal of the inverter 36 is connected to the node A. Hereinafter, a connection point between the PMOS transistor 34a and the NMOS transistor 34b is referred to as "node D".

Both a drain of the NMOS transistor 31 and a drain of the NMOS transistor 32 are connected to the MTJ devices M1 and M2, and both a source of the NMOS transistor 31 and a source of the NMOS transistor 32 are connected to a drain of the NMOS transistor 13. A gate of the NMOS transistor 31 is connected to the node C. A gate of the NMOS transistor 32 is connected to the node D. A source of the NMOS transistor 13 is grounded, and the clock clk is input into a gate thereof.

The PMOS transistor 37 has a source connected to the power supply VDD, a drain connected to the node A, and a gate connected to the node C. The PMOS transistor 38 has a source connected to the power supply VDD, a drain connected to the node B, and a gate connected to the node D.

Figure 4:
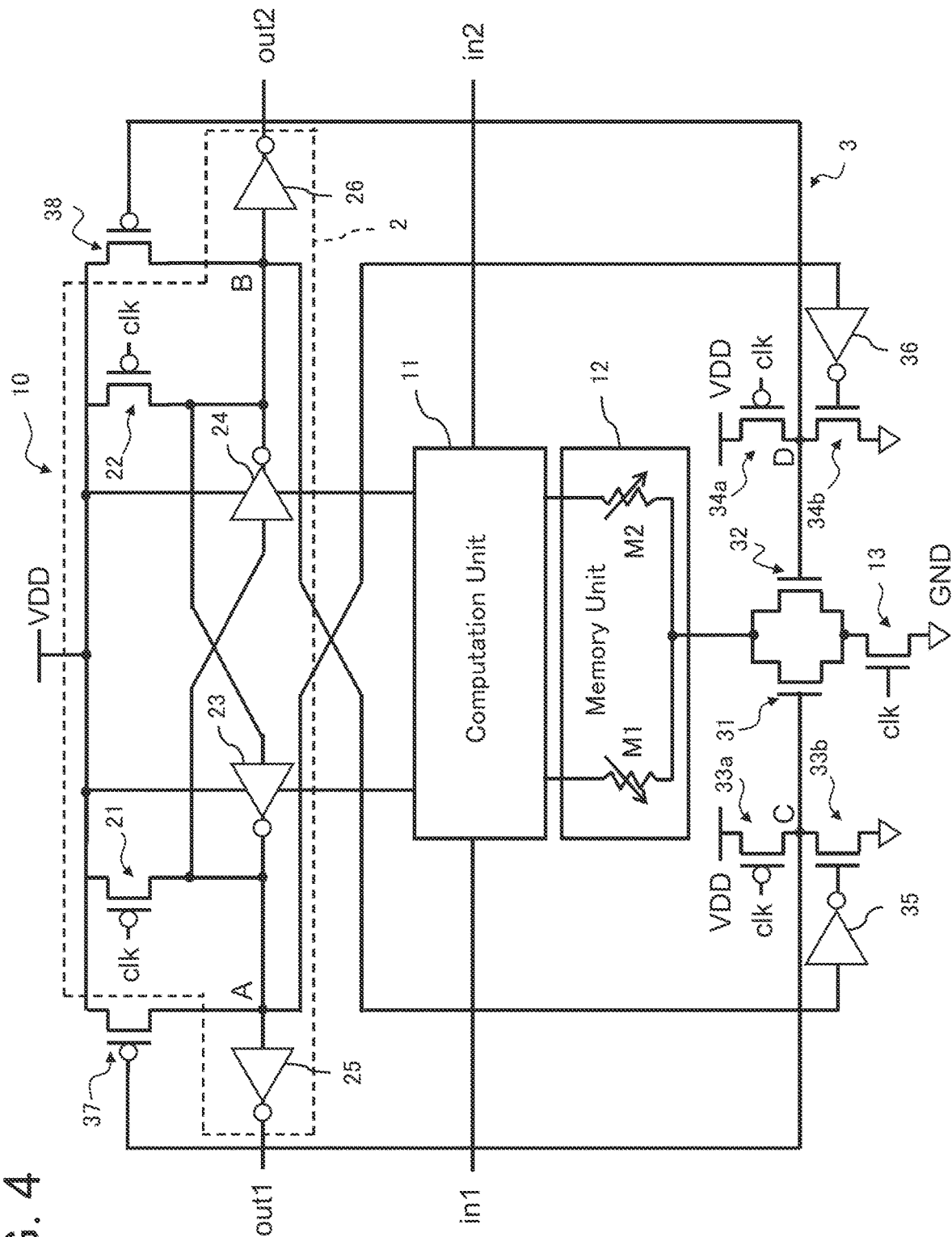
FIG. 4 is a schematic diagram illustrating a configuration of the nonvolatile logic circuit of the embodiments.

The computation unit 11 shown in FIG. 4 is designed in different circuit configurations depending on the types of logical operations. As an example of the nonvolatile logic circuit 10 shown in FIG. 4, FIG. 5 shows a circuit configuration of a nonvolatile logic circuit 10A that includes a computation unit 11A for performing XNOR operations. The computation unit 11A has a pass-transistor structure, and includes NMOS transistors 11a, 11b, 11c, and 11d.

Both a drain of the NMOS transistor 11a and a drain of the NMOS transistor 11b are connected to a source of an NMOS transistor constituting the CMOS inverter 23. A source of the NMOS transistor 11a is connected to the MTJ device M1, and a source of the NMOS transistor 11b is connected to the MTJ device M2. The signal in2 is input into a gate of the NMOS transistor 11a, and the signal in1 is input into a gate of the NMOS transistor 11b.

Both a drain of the NMOS transistor 11c and a drain of the NMOS transistor 11d are connected to a source of an NMOS transistor constituting the CMOS inverter 24. A source of the NMOS transistor 11c is connected to the MTJ device M2, and a source of the NMOS transistor 11d is connected to the MTJ device M1. The signal in2 is input into a gate of the NMOS transistor 11c, and the signal in1 is input into a gate of the NMOS transistor 11d.

Figure 5:
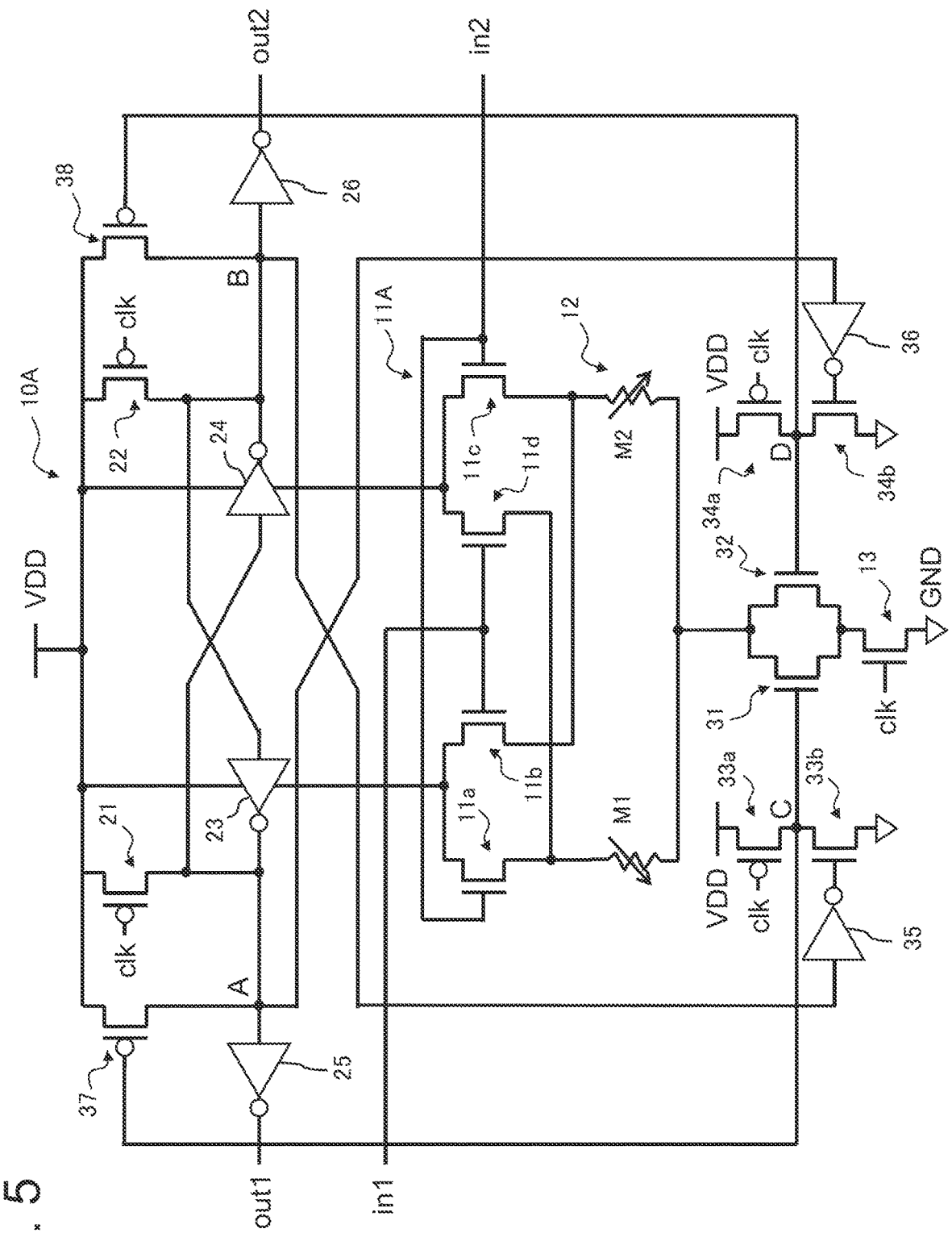
FIG. 5 is a schematic diagram illustrating a configuration of a nonvolatile logic circuit for performing XNOR operations as an example of the nonvolatile logic circuit shown in FIG. 4.

Next, the behavior of the nonvolatile logic circuit 10A shown in FIG. 5 is described with reference to FIGS. 6 to 9. In FIGS. 8A to 8D, any components and wiring lines which have no direct contribution to the circuit behavior are indicated by dotted lines or not illustrated.

Figure 6:
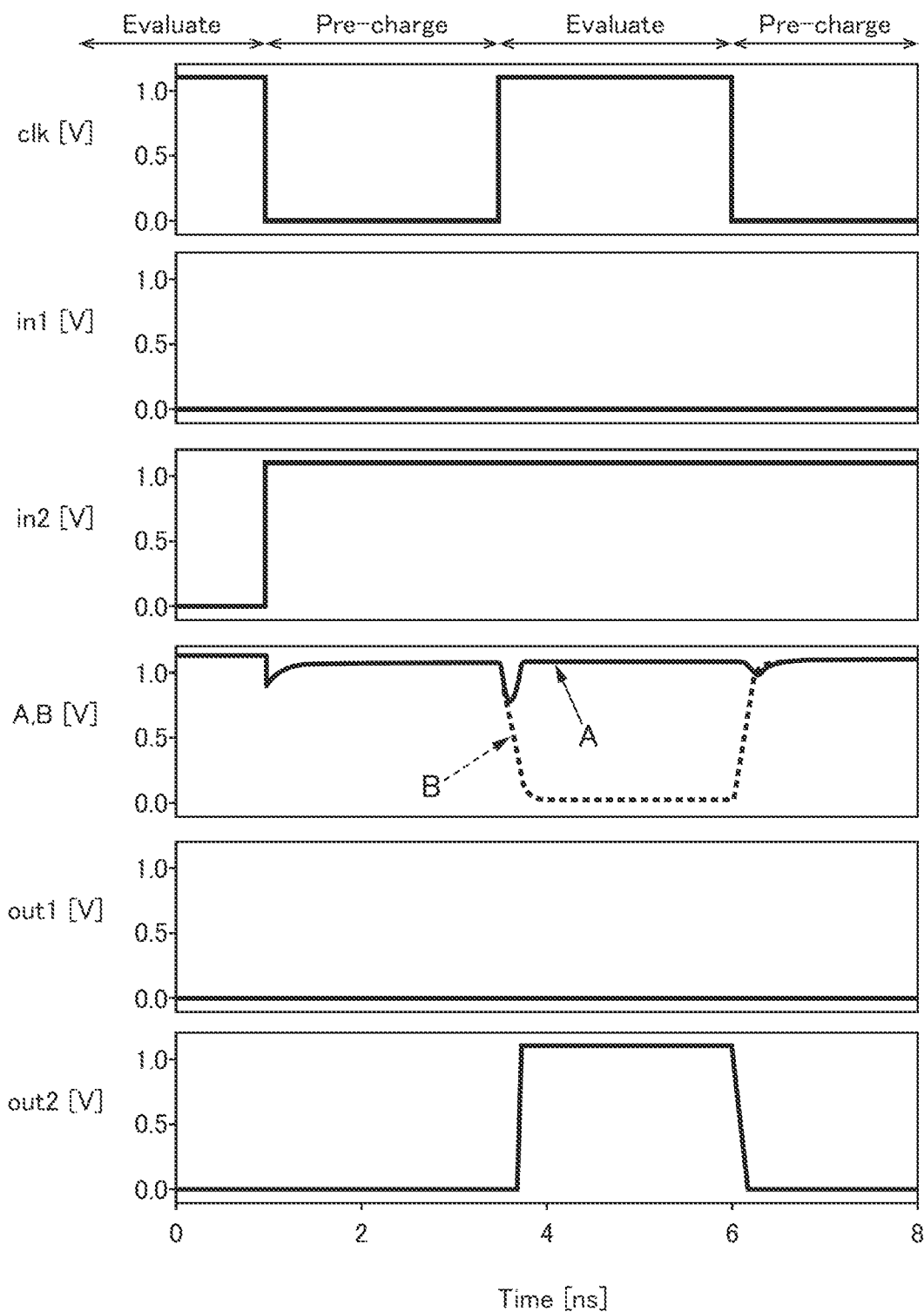
FIG. 6 is a schematic diagram illustrating a waveform of the nonvolatile logic circuit when a pair of MTJ devices is in a complementary state.
Figure 7:
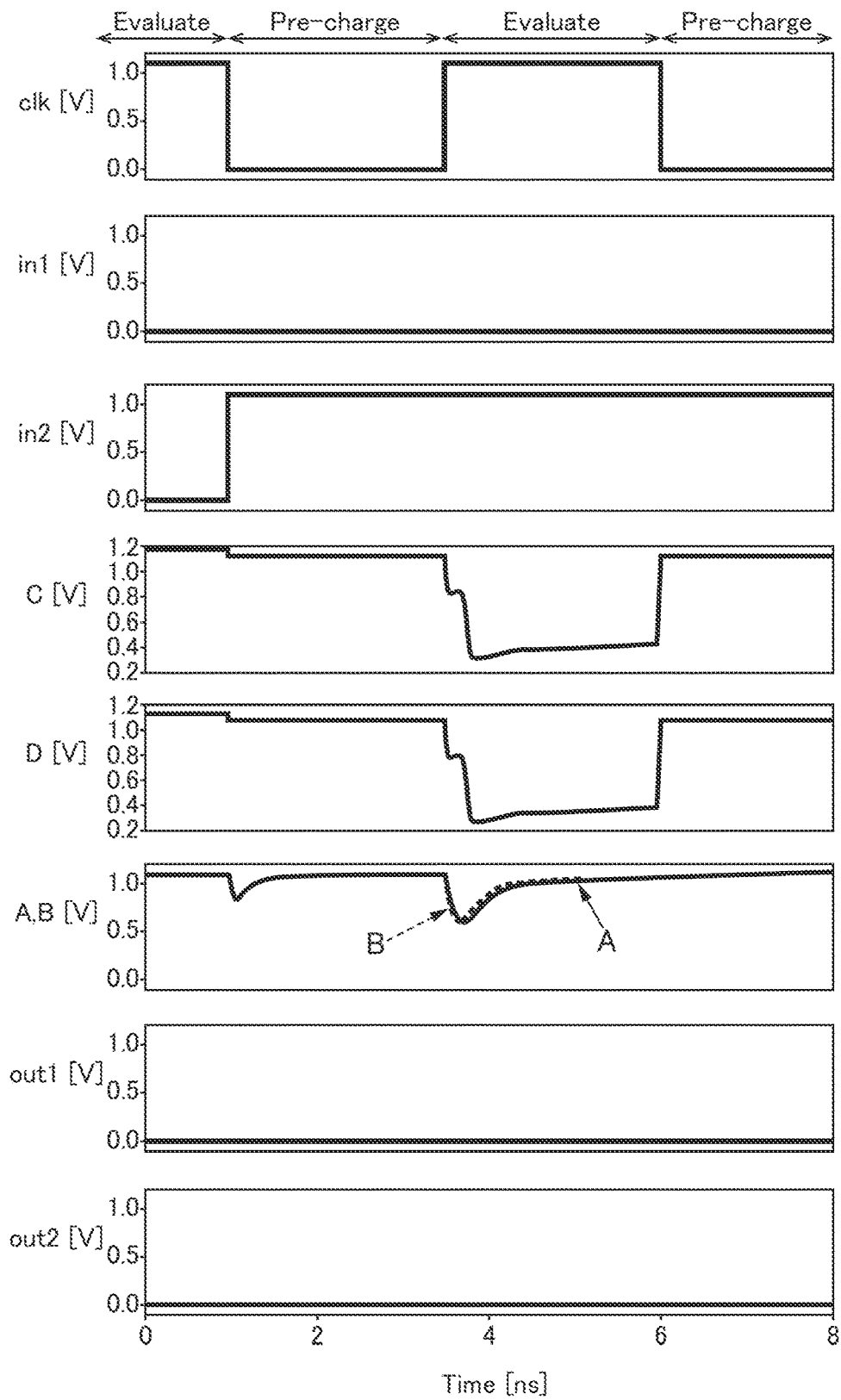
FIG. 7 is a schematic diagram illustrating a waveform of the nonvolatile logic circuit when the pair of MTJ devices is in a non-complementary state.

As is shown by waveforms in FIGS. 6 and 7, the nonvolatile logic circuit 10A performs dynamic operations taking two phases of Pre-charge and Evaluate according to the clock clk (see Non-Patent Literature 1).

First, the behavior of the nonvolatile logic circuit 10A when the pair of MTJ devices M1 and M2 is in a complementary state is described with reference to FIG. 6 and FIGS. 8A to 8D. Here, let us assume that the MTJ devices M1 and M2 are in a high-resistance state $R_{AP}$ and a low-resistance state $R_P$, respectively, and the input signals in1 and in2 are set to L level and H level, respectively. Hereinbelow, L level corresponds to 0 [V] ("0") and H level corresponds to a power supply voltage [V] ("1").

Figure 8A:
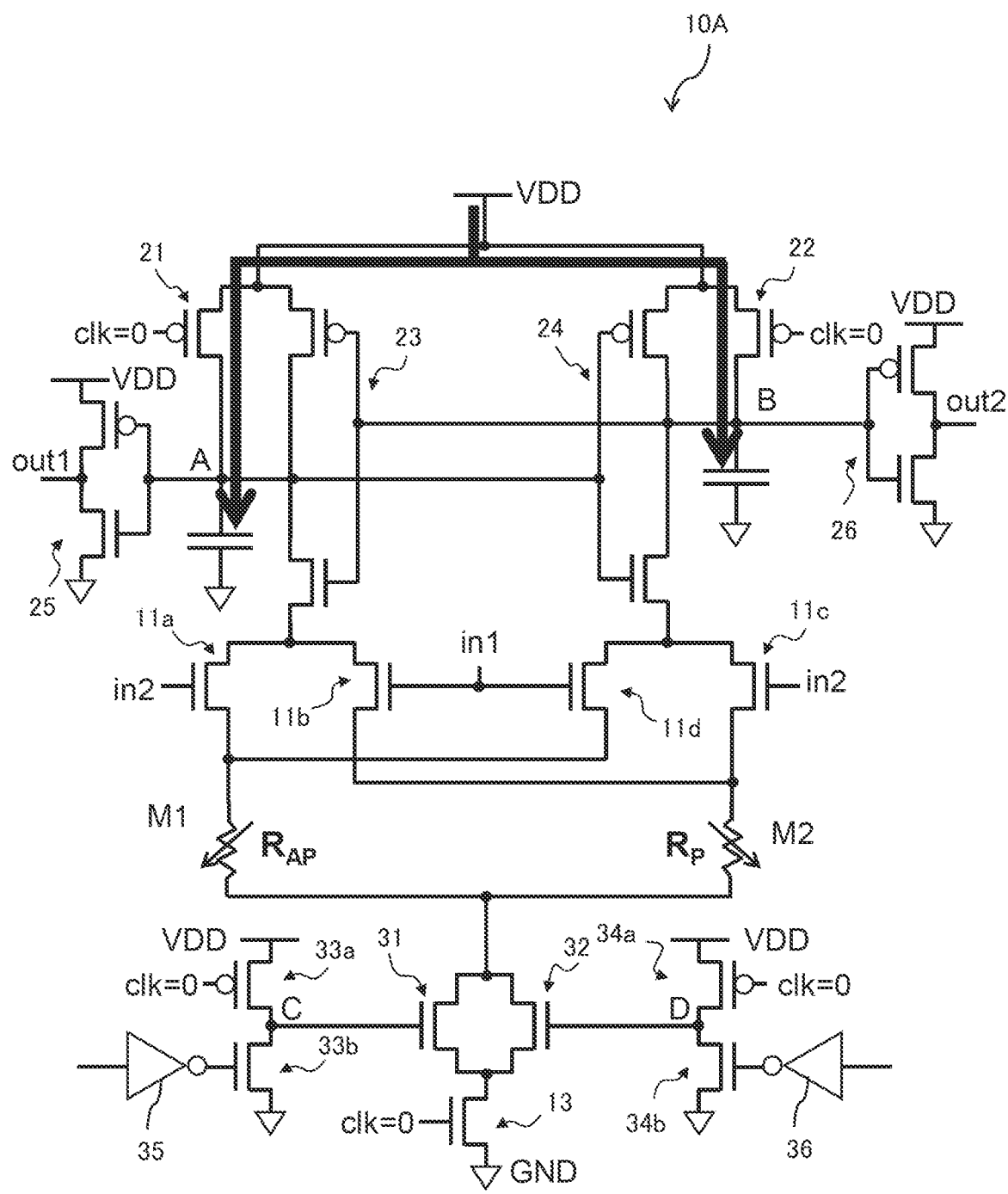
FIG. 8A is a schematic diagram illustrating a behavior of the nonvolatile logic circuit in a pre-charge period when the pair of MTJ devices is in a complementary state.
Figure 8B:
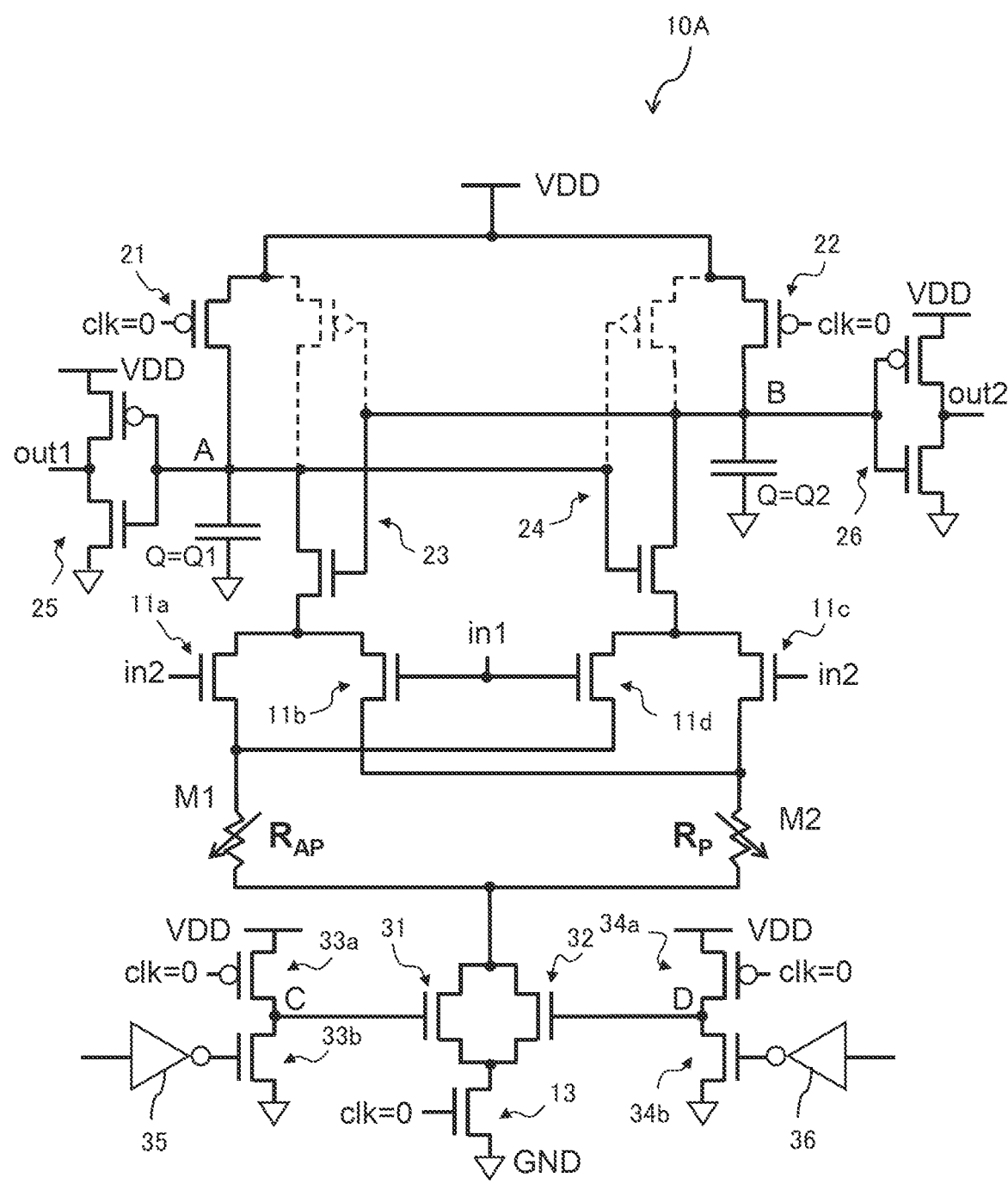
FIG. 8B is another schematic diagram illustrating the behavior of the nonvolatile logic circuit in the pre-charge period when the pair of MTJ devices is in a complementary state.

In the pre-charge period (clk=0), as shown in FIG. 8A, the PMOS transistors 21 and 22 are turned ON, and the nodes A and B are charged by the power supply VDD via the PMOS transistors 21 and 22, respectively. Therefore, as shown in FIG. 8B, electric charges Q1 are accumulated in the node A and electric charges Q2 are accumulated in the node B, the nodes A and B both become H level, and the output signal out1 from the CMOS inverter 25 and the output signal out2 from the CMOS inverter 26 both indicate L level. The PMOS transistors 33a and 34a are also turned ON in the Pre-charge period (clk=0), thus the nodes C and D are also charged and become H level.

When the nodes A and B become H level in this manner, the NMOS transistor of the CMOS inverter 24 is turned ON, and the NMOS transistor of the CMOS inverter 23 is turned ON. When the nodes C and D become H level, the NMOS transistors 31 and 32 are also turned ON.

Figure 8C:
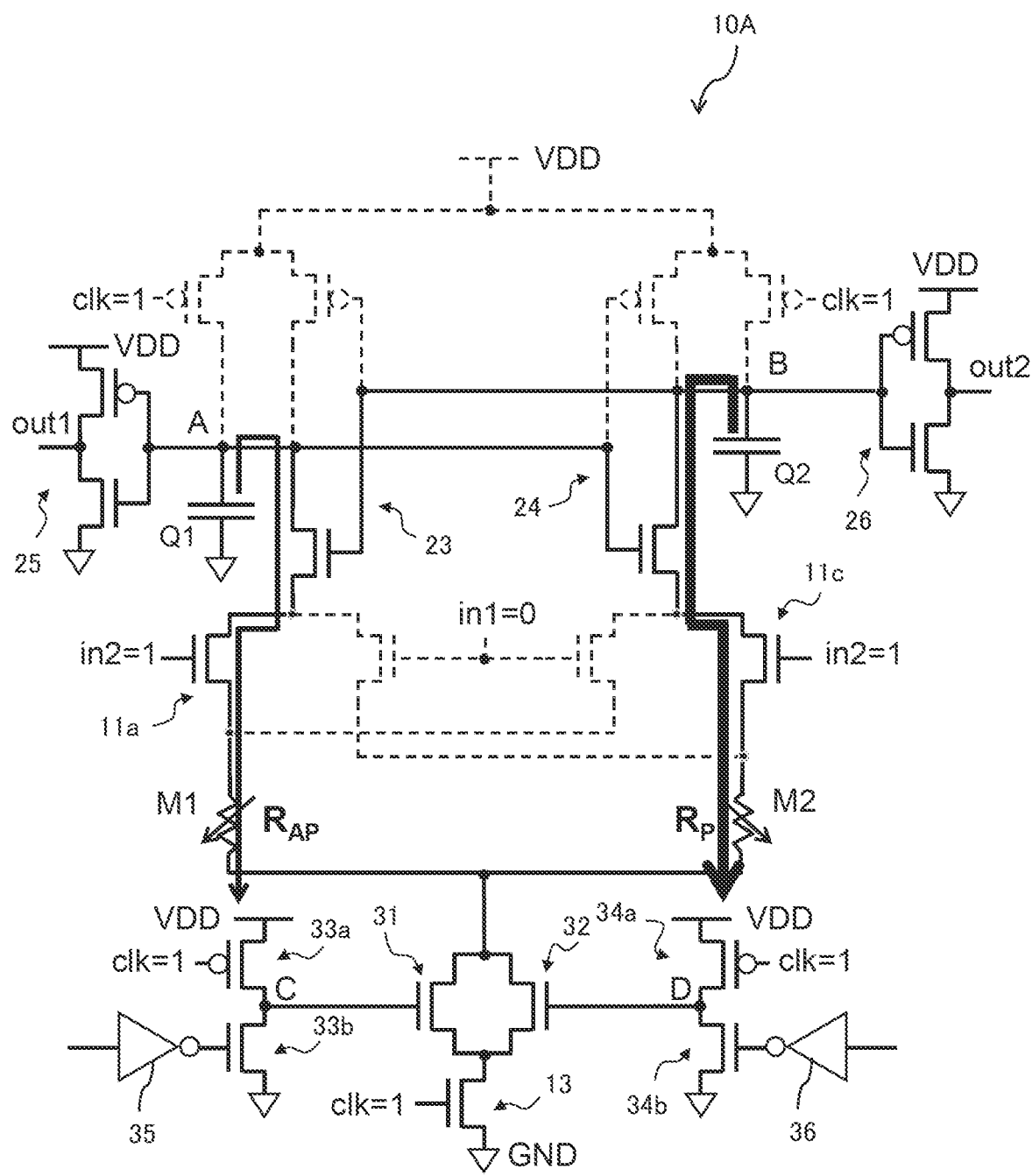
FIG. 8C is a schematic diagram illustrating the behavior of the nonvolatile logic circuit in an evaluate period when the pair of MTJ devices is in a complementary state.

In the evaluate period (clk=1), the NMOS transistor 13 is turned ON. As shown in FIG. 8C, since the NMOS transistors 11a and 11c are ON due to the input signal in2=1, the electric charges Q1 accumulated in the node A begin to flow into GND via the NMOS transistor 11a, the MTJ device M1, and the NMOS transistor 13, and the electric charges Q2 accumulated in the node B begin to flow into GND via the NMOS transistor 11c, the MTJ device M2, and the NMOS transistor 13.

At this time, since the pair of MTJ devices M1 and M2 is in a complementary state, the discharge speed of the electric charges Q1 accumulated in the node A is different from that of the electric charges Q2 accumulated in the node B. Specifically, an electric current does not easily pass through the MTJ device M1 in a high-resistance state $R_{AP}$ and thus the electric charges flow slowly, while an electric current easily passes through the MTJ device M2 in a low-resistance state $R_P$, which allows the electric charges to flow fast. Therefore, as shown in FIG. 6, a voltage difference between the nodes A and B increases gradually.

Figure 8D:
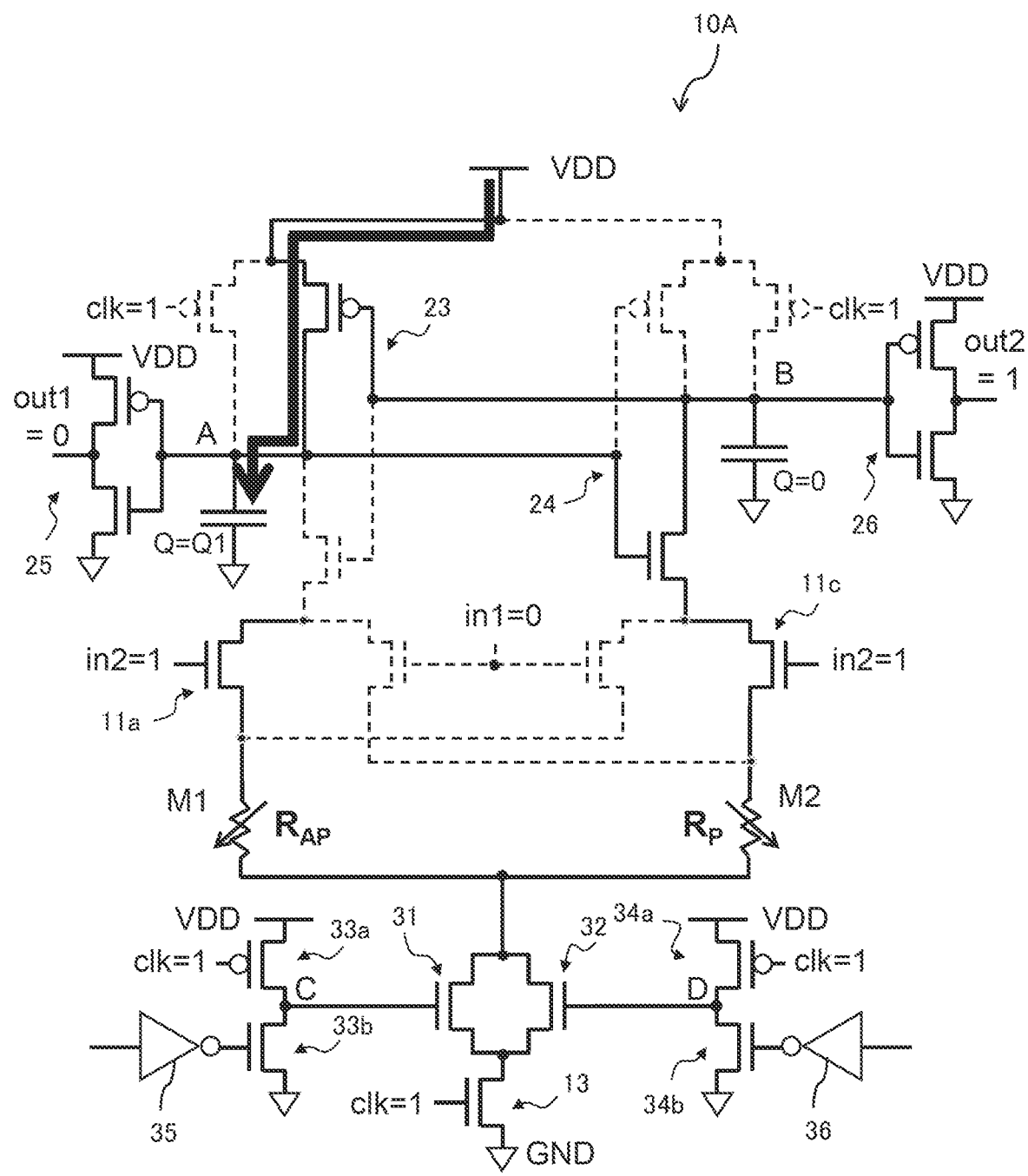
FIG. 8D is another schematic diagram illustrating the behavior of the nonvolatile logic circuit in the evaluate period when the pair of MTJ devices is in a complementary state.

As shown in FIG. 8D, when the voltage of the node B becomes less than a threshold voltage of the CMOS inverter 23, the PMOS transistor of the CMOS inverter 23 is turned ON, and the node A is recharged (Q=Q1) by the power supply VDD via the PMOS transistor of the CMOS inverter 23. Meanwhile, the electric charges continue to flow from the node B into GND via the NMOS transistor 11c, the MTJ device M2, and the NMOS transistor 13, and eventually, the node B is fully discharged (Q=0).

When the voltage difference between the nodes A and B reaches a certain value, the nodes A and B become H level L level, respectively, by further amplifying the voltage difference between the nodes A and B by the CMOS inverters 23 and 24. Thus the output signals are determined to be out1=0 and out2=1. Based on the output signals in the evaluate period, it is possible to determine that the MTJ devices M1 and M2 are in a complementary state, and determine that the MTJ device M1 is in a high-resistance state $R_{AP}$ and the MTJ device M2 is in a low-resistance state $R_P$.

Next, the behavior of the nonvolatile logic circuit 10A when the pair of MTJ devices M1 and M2 is in a non-complementary state is described with reference to FIGS. 7 and 9. Here, let us assume that both the MTJ devices M1 and M2 are in a low-resistance state $R_P$, and the input signals in1 and in2 are set to L level ("0") and H level ("1"), respectively.

In the pre-charge period (clk=0), the nonvolatile logic circuit 10A shows the same behavior irrespective of whether the pair of MTJ devices M1 and M2 is in a complementary state or a non-complementary state (see FIGS. 8A and 8B).

In the evaluate period (clk=1), the electric charges accumulated in the node A begin to flow into GND via the NMOS transistor 11a, the MTJ device M1, and the NMOS transistor 13, and the electric charges accumulated in the node B begin to flow into GND via the NMOS transistor 11c, the MTJ device M2, and the NMOS transistor 13. At this time, since the pair of MTJ devices M1 and M2 is in a non-complementary state, no difference is created between the discharge speed of the electric charges accumulated in the node A and the discharge speed of the electric charges accumulated in the node B. Thus, both the voltage of the node A and the voltage of the node B continue to drop simultaneously.

Figure 9:
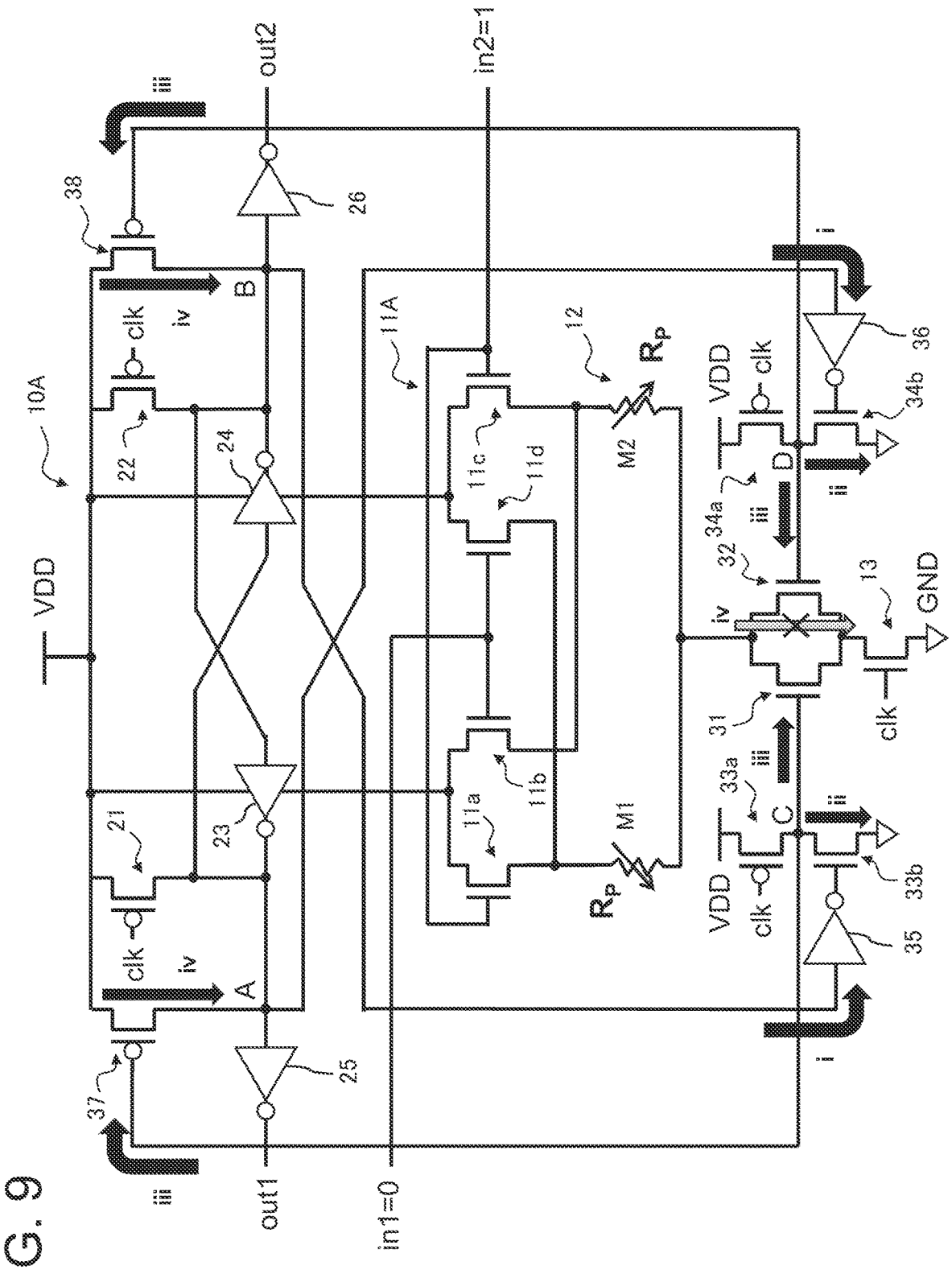
FIG. 9 is a schematic diagram illustrating a behavior of the nonvolatile logic circuit when the pair of MTJ devices is in a non-complementary state.

When the voltage of the node A and the voltage of the node B become less than a threshold voltage of the inverters 35 and 36, the NMOS transistors 33b and 34b are turned ON ((i) in FIG. 9), and the nodes C and D, which are pre-charged in the pre-charge period, begin to be discharged ((ii) in FIG. 9), causing both the voltage of the node C and the voltage of the node D to drop. Accordingly, the PMOS transistors 37 and 38 are turned on, and the NMOS transistors 31 and 32 are turned off ((iii) in FIG. 9). As a result, the NMOS transistors 31 and 32 become non-conductive, while the nodes A and B are recharged by the power supply VDD via the PMOS transistors 37 and 38, respectively ((iv) in FIG. 9). Consequently, the nonvolatile logic circuit 10A becomes the same state as in the pre-charge period, both the nodes A and B become H level, and the output signals become out1=0 and out2=0. In this manner, it is possible to determine that the MTJ devices M1 and M2 are in a non-complementary state based on the output signals in the evaluate period.

Conventional nonvolatile logic circuits do not include the determination circuit 3 (especially the PMOS transistor 33a, the NMOS transistor 33b, the PMOS transistor 34a, the NMOS transistor 34b, the inverters 35 and 36, and the PMOS transistors 37 and 38). In such conventional nonvolatile logic circuits, when the pair of MTJ devices M1 and M2 is in a non-complementary state, in the evaluate period (clk=1), no difference is created between the discharge speed of the electric charges accumulated in the node A and the discharge speed of the electric charges accumulated in the node B, thus both the voltage of the node A and the voltage of the node B continue to drop simultaneously, which leads to an unstable circuit behavior. Specifically, due to device variations and other factors, the conventional nonvolatile logic circuit transitions to any one of stable states in a static random-access memory (SRAM) structure having two inverters. In this way, according to the conventional nonvolatile logic circuits, it is not possible to ensure the output results corresponding to a non-complementary state, which eliminates the utilization of a non-complementary state. When the nonvolatile logic circuit suddenly become a non-complementary state, the non-complementary state cannot be identified.

On the other hand, according to the nonvolatile logic circuit 10A of the embodiments, when the pair of MTJ devices M1 and M2 is in a non-complementary state, in the evaluate period, the determination circuit 3 detects that the voltage of the nodes A and B of the output circuit 2 drops below the threshold voltage, and recharges the nodes A and B to prevent further discharge. This makes it possible to ensure the output results corresponding to a non-complementary state and identify the non-complementary state. Needless to say, it is also possible to identify the non-complementary state when the pair of MTJ devices M1 and M2 is in a high-resistance state $R_{AP}$.

As described above, according to the nonvolatile logic circuits 10 and 10A of the embodiments, a new mechanism of detecting a non-complementary state never used before (i.e., the determination circuit 3) is embedded in the conventional circuit structure in which the pair of MTJ devices taking a complementary state is used to represent 1 bit (two states). With this mechanism, it is possible to achieve a sophisticated function without an increase in circuit area. Moreover, by utilizing not only a complementary state but also a non-complementary state, it possible to make maximal use of the properties of the MTJ devices to design the circuit. In addition, even when the pair of MTJ devices M1 and M2 is in a non-complementary state, the output results corresponding to a non-complementary state are ensured, which leads to enhancement of reliability.

Example 1

Next, with reference to FIGS. 10 to 13, an explanation will be given for Example 1 in which the nonvolatile logic circuit 10A according to the embodiments (see FIGS. 5 to 9) is applied to ternary neural networks (TNNs).

Figure 10:
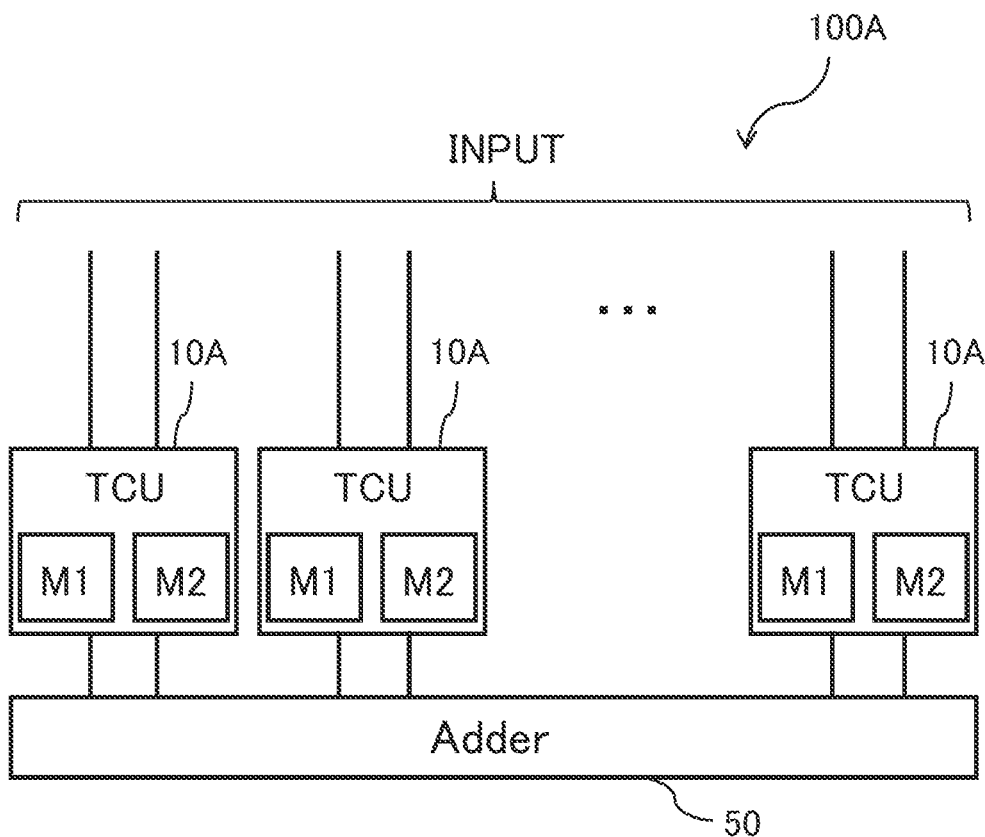
FIG. 10 is a block diagram illustrating a configuration of a computation apparatus according to Example 1 of the embodiments.

FIG. 10 is a block diagram illustrating a configuration of a computation apparatus 100A according to Example 1. As shown in FIG. 10, the computation apparatus 100A includes multiple nonvolatile logic circuits 10A and an adder 50 which is connected to output terminals of each of the multiple nonvolatile logic circuits 10A. In Example 1, each of the nonvolatile logic circuits 10A corresponds to a ternary computation unit (TCU) which is a main component of TNN.

Figure 11:
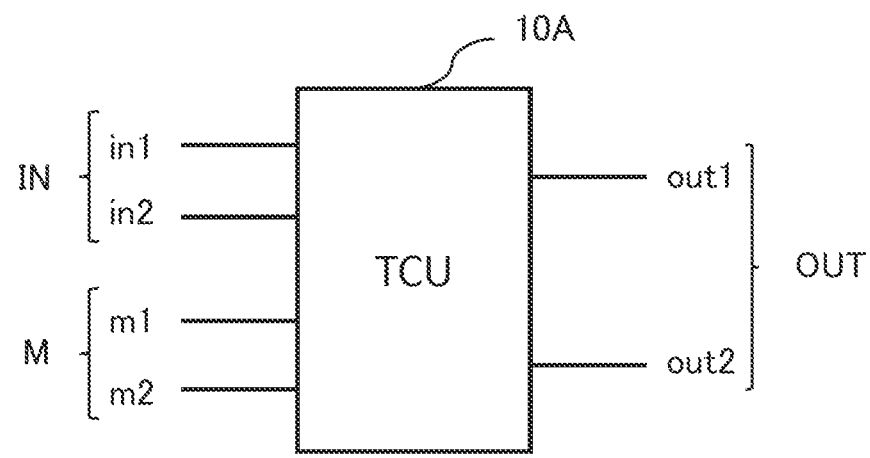
FIG. 11 is a schematic diagram illustrating signals related to an operation performed by each nonvolatile logic circuit constituting the computation apparatus of Example 1.

In Example 1, resistance states of a pair of MTJ devices M1 and M2 are denoted by m1 and m2, respectively. A high-resistance state $R_{AP}$ and a low-resistance state $R_P$ are denoted by "1" and "0", respectively. As shown in FIG. 11, a logic value of input signals (in1, in2) is denoted by IN, a logic value of resistance states (m1, m2) is denoted by M, and a logic value of output signals (out1, out2) is denoted by OUT. Further, as shown in FIG. 12, logic values "+1", "0", and "−1" are assigned to three states (0, 1), (0, 0), and (1, 0), respectively.

FIG. 13 shows a truth table representing a calculation function of each of the nonvolatile logic circuits 10A. Each of the nonvolatile logic circuits 10A multiplies the input signals (in1, in2) by the resistance states (m1, m2) as weight coefficients to obtain the output signals (out1, out2). In other words, the multiplication IN×M=OUT is performed. The output signals (out1, out2) obtained by the multiple nonvolatile logic circuits 10A are added by the adder 50.

According to Example 1, using also the non-complementary state (0, 0) as a means for representing information can lead to a compact configuration of the operation block TCU for performing multiplication with ternary representation (+1, 0, −1) in TNN using the two MTJ devices M1 and M2. This makes a breakthrough for AI hardware needs by means of circuit and device technologies.

Example 2

Next, with reference to FIG. 14, an explanation will be given for Example 2 in which the nonvolatile logic circuit 10 according to the embodiments is applied to error detection.

Figure 14:
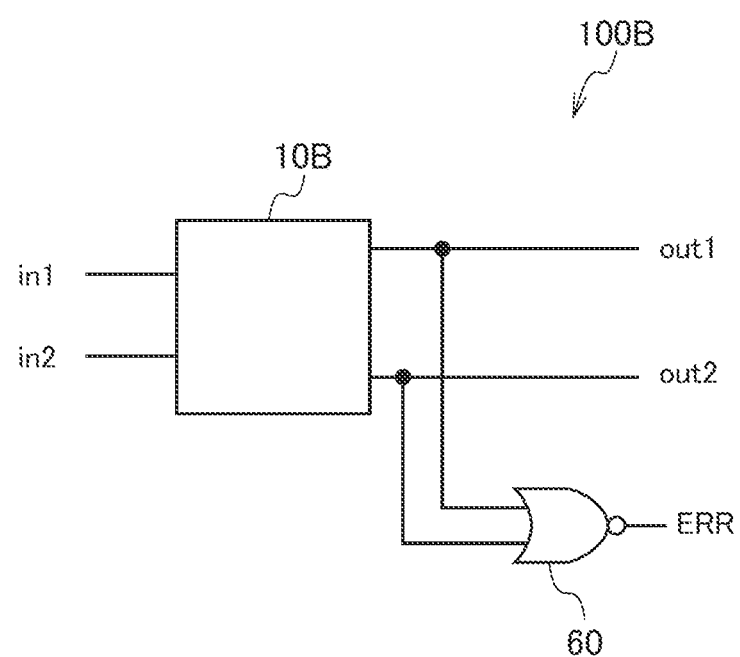
FIG. 14 is a block diagram illustrating a configuration of an error detection apparatus according to Example 2 of the embodiments.

FIG. 14 shows a configuration of an error detection apparatus 100B according to Example 2. As shown in FIG. 14, the error detection apparatus 100B includes a nonvolatile logic circuit 10B and an NOR gate 60. The nonvolatile logic circuit 10B shares the same circuit configuration with the nonvolatile logic circuit 10 shown in FIG. 4. Output terminals of an output circuit 2 of the nonvolatile logic circuit 10B are connected to input terminals of the NOR gate 60.

When a pair of MTJ devices M1 and M2 of the nonvolatile logic circuit 10B is in a complementary state, the output signals out1 and out2 also take complementary values ((0, 1) or (1, 0)), and a logic value of "0" is output from the NOR gate 60. On the other hand, when the pair of MTJ devices M1 and M2 is in a non-complementary state, the output signals out1 and out2 also take non-complementary values (0, 0) in the Evaluate period, and a logic value of "1" is output from the NOR gate 60 as an error signal ERR.

According to Example 2, even if the pair of MTJ devices M1 and M2 becomes a non-complementary state due to write error or read disturb, it is possible to assure that both the output signals outland out2 are low voltage values. Therefore, it is no longer necessary to provide an additional reference resistor or comparison circuit as disclosed in Non-Patent Literature 2, and it is possible to detect whether a failure occurs in the state of the pair of MTJ devices M1 and M2 merely by checking whether the output signals out1 and out2 are complementary outputs in the Evaluate period.

The present invention is not limited to the above embodiments, and many modifications and variations will be apparent to those of ordinary skill in the art without departing from the scope of the present invention.

For example, although the computation unit 11A for performing XNOR operations has been described in the above embodiments as an example of the computation unit 11, any other circuit configuration for performing another logical operation (such as AND, OR) may be employed according to the purpose of operations.

In addition, the resistive memory elements of the memory unit 12 are not limited to MTJ devices, and any other such resistive memory elements may also be employed.

REFERENCE SIGNS LIST 1 computation circuit
2 output circuit
3 determination circuit
10, 10A, 10B nonvolatile logic circuit
11, 11A computation unit
12 memory unit
12a free layer
12b barrier layer
12c fixed layer
13, 31, 32, 33b, 34b NMOS transistor
21, 22, 33a, 34a, 37, 38 PMOS transistor
23, 24, 25, 26 CMOS inverter
50 adder
60 NOR gate
100A computation apparatus
100B error detection apparatus
A, B, C, D node
M1, M2 MTJ device

The invention claimed is:
1. A nonvolatile logic circuit, comprising:
a memory unit having a pair of resistive memory elements;
a computation unit connected to the memory unit and configured to perform an operation based on an input signal and a logic value corresponding to a resistance state of the pair of resistive memory elements;

a determination circuit configured to determine whether the resistance state of the pair of resistive memory elements is a complementary state or a non-complementary state; and an output circuit connected to the computation unit and the determination circuit, and configured to output a signal corresponding to an operation result by the computation unit or a signal corresponding to a determination result by the determination circuit.

2. The nonvolatile logic circuit according to claim 1, wherein when the resistance state of the pair of resistive memory elements is the complementary state, the computation unit is configured to perform the operation using the input signal and the logic value corresponding to the complementary state, and the output circuit is configured to output the signal corresponding to the operation result by the computation unit.

3. The nonvolatile logic circuit according to claim 1, wherein when the resistance state of the pair of resistive memory elements is the non-complementary state, the output circuit is configured to output the signal indicating that the resistance state of the pair of resistive memory elements is the non-complementary state.

4. The nonvolatile logic circuit according to claim 1, wherein when the resistance state of the pair of resistive memory elements is the non-complementary state, the computation unit is configured to perform the operation using the input signal and the logic value corresponding to the non-complementary state, and the output circuit is configured to output the signal corresponding to the operation result by the computation unit.

5. The nonvolatile logic circuit according to claim 1, wherein the output circuit includes a pair of nodes having voltage configured to vary depending on the resistance state of the pair of resistive memory elements, and the determination circuit is configured to detect the voltage of the pair of nodes to determine whether the resistance state of the pair of resistive memory elements is the complementary state or the non-complementary state.

6. The nonvolatile logic circuit according to claim 5, wherein when the resistance state of the pair of resistive memory elements is the non-complementary state, and the voltage of the pair of nodes drops below a threshold voltage, the determination circuit is configured to charge the pair of nodes.

7. The nonvolatile logic circuit according to claim 1, wherein each of the pair of resistive memory elements is a magnetic tunnel junction device.

* * * * *